United States Patent
Takagi et al.

(10) Patent No.: US 6,387,536 B1
(45) Date of Patent: May 14, 2002

(54) Al ALLOY THIN FILM FOR SEMICONDUCTOR DEVICE ELECTRODE AND SPUTTERING TARGET TO DEPOSIT Al FILM BY SPUTTERING PROCESS FOR SEMICONDUCTOR DEVICE ELECTRODE

(75) Inventors: Katsutoshi Takagi; Takashi Onishi, both of Kobe (JP)

(73) Assignee: Kabushiki Kaisha Kobe Seiko Sho., Kobe (JP)

( * ) Notice: Subject to any disclaimer, the term of this patent is extended or adjusted under 35 U.S.C. 154(b) by 83 days.

(21) Appl. No.: 09/612,383

(22) Filed: Jul. 7, 2000

(30) Foreign Application Priority Data

Jul. 15, 1999 (JP) ............................................. 11-201650

(51) Int. Cl.$^7$ ......................... C23C 14/00; H01L 29/12; B32B 15/00
(52) U.S. Cl. ........................ 428/620; 428/650; 428/938; 420/552; 204/298.13; 204/192.17
(58) Field of Search ............................... 428/620, 650, 428/938; 420/552; 204/298.13, 192.17; 257/171

(56) References Cited

U.S. PATENT DOCUMENTS

| | | | |
|---|---|---|---|
| 5,500,301 A | 3/1996 | Onishi et al. ................ | 428/457 |
| 5,514,909 A | 5/1996 | Yamamoto et al. .......... | 257/765 |
| 5,593,515 A | * 1/1997 | Masumoto et al. | |
| 5,903,055 A | * 5/1999 | Takayama | |
| 5,976,641 A | 11/1999 | Onishi et al. ................ | 428/1.3 |
| 6,033,542 A | 3/2000 | Yamamoto et al. ..... | 204/298.13 |
| 6,096,438 A | * 8/2000 | Takagi et al. | |

FOREIGN PATENT DOCUMENTS

| | | |
|---|---|---|
| JP | 05100248 | 4/1993 |
| JP | 06299354 | 10/1994 |
| JP | 07011426 | 1/1995 |
| JP | 07090552 | 4/1995 |

OTHER PUBLICATIONS

Vol. 10, #7,8, Jan. 1991 A candidate for interconnection material; AI–Y alloy thin films (Young K. Lee et al).
4934–4940, Nov. 1993 Mechanical Effects of Hafnium and Boron Addition to Aluminum Alloy Films for Submicrometer LSI Interconnects (H. Onoda et al) Jpn J. appl. Phys. Part 1.
2542, Sep. 1991, Annealing behavior of Al–Y alloy film for interconnection conductor in microelectronic devices (Y.K. Lee et al) J. Vac.Sci Technol B.

(List continued on next page.)

*Primary Examiner*—Deborah Jones
*Assistant Examiner*—Jason Savage

(57) ABSTRACT

The present invention provides an Al alloy thin film for a semiconductor device electrode having an electrical resistivity of as low as 6 $\mu\Omega$cm or less, high hillock resistance, high void resistance, and high corrosion resistance against an alkaline solution, which are required for an electrode thin film of large-screen liquid crystal display (LCD) or high-resolution LCD. The present invention also provides a sputtering target to deposit the Al alloy film by sputtering process for a semiconductor device electrode. The Al alloy thin film for a semiconductor device electrode satisfies the conditions of Y$\geq$0.3 at %, IVa group metal element$\geq$0.2 at %, and $0.3C_y+3C_{IVa}\leq 2$ (wherein $C_y$: Y content (at %), $C_{IVa}$: content of IVa group metal element (at %)), and the sputtering target is made of an Al alloy satisfying the above conditions.

9 Claims, 9 Drawing Sheets

OTHER PUBLICATIONS

2499, Jul. 1996, Effects of Y or Gd addition on the structures and resistivities of Al think films (S. Takayama et al) J. Vac. Sci, Technol A.

1990, Nov. 1997 Characterization of Al–Y alloy thin films deposited by direct current magnetron sputtering (Liu et al) J. Vac.Sci Technol B.

Aug. 1995, Effects of Y or GD addition on the structure of Al thin films (S. Takayama et al) Int.Conf. On Solid State Devices and Materials.

Sep. 1997, Characterization of anodic oxide film (K. Tagaki et al) Abstracts of the Japan Institute of Metals.

Improvement of Al alloy interconnect by Hf and B addition. (E. Takahashi et al) Extended Abstracts of the Japan Society of Applied Physics and Related Societies, No month or year.

22, Characteristics of annealed Al–Y alloy (Y.K. Lee et al)1, No month or year.

* cited by examiner

Al ALLOY THIN FILM FOR SEMICONDUCTOR DEVICE ELECTRODE AND SPUTTERING TARGET TO DEPOSIT Al FILM BY SPUTTERING PROCESS FOR SEMICONDUCTOR DEVICE ELECTRODE

BACKGROUND OF THE INVENTION

1. Field of the Invention

The present invention relates to the technical field of an Al alloy thin film for semiconductor device electrodes and a sputtering target to deposit the Al film by sputtering process for semiconductor device electrodes. Particularly, the present invention relates to the technical field of an Al alloy thin film for semiconductor device electrodes suitable as electrodes (thin film electrodes and interconnections) of a thin film transistor-liquid crystal display, and a sputtering target to deposit the Al film by sputtering process for semiconductor device electrodes.

2. Description of the Related Art

Liquid crystal displays (referred to as "LCDS" hereinafter) as semiconductor devices permit decreases in thickness, weight, and power consumption, and the formation of an image with high resolution, as compared with conventional display devices comprising cathode ray tubes. Therefore, LCDs are used displays for television sets and personal computers, etc. In recent years, a thin film transistor-liquid crystal display (referred to as "TFT-LCD" hereinafter) having a structure in which a thin film transistor (referred to as "TFT" hereinafter) is incorporated as a switching element for each LCD pixel has become the mainstream. The TFT represents an active element comprising a semiconductor thin film, and electrodes (thin film electrodes and interconnections) comprising metal thin films connected to the semiconductor thin film. Therefore, the semiconductor device electrode is defined as an electrode (a thin film electrode or interconnection) used as a part of TFT. In a TFT, the electrode and interconnection are electrically connected.

A thin film (referred to as an "electrode thin film" hereinafter) used for an electrode of the LCD is required to have various properties, and especially low electrical resistivity, high hillock resistance, high void resistance, and high corrosion resistance are considered important. These characteristics are considered important because of the following reasons.

[1] The reason why low electrical resistivity is required is first described. The electrical resistivity of a material used as the LCD electrode thin film affects the transmission rate of an electric signal transmitted through the material. For example, the use of a material having high electrical resistivity as the electrode thin film causes a decrease in the transmission rate of an electric signal, and thus causes deterioration in the display performance of LCD due to an electric signal delay. Therefore, low electrical resistivity is required for preventing the occurrence of such an electric signal delay.

[2] Next, the reason why high hillock resistance (meaning that no hillock occurs by heat treatment) is required, and the reason why high void resistance (meaning that no void occurs by heat treatment) is required are described. After the deposition of the electrode thin film, the electrode thin film is annealed at about 300 to 400° C. in the LCD manufacturing process. This is because of the presence of a step requiring heating, such as the step of forming a Si semiconductor layer, after the deposition of the electrode thin film. For example, in the use of a material having poor hillock resistance and void resistance, such as a pure Al thin film, for the electrode thin film, the heat treatment causes small convexities such as hillocks (protrusions caused by compressive stress as driving force due to a difference in the thermal expansion coefficient between a substrate and a thin film), or small concavities such as voids (recesses caused by compressive stress as driving force due to a difference between the thermal expansion coefficients of a substrate and a thin film) on the surface of the thin film. Conventionally, the electrode thin film is located at the bottom of the multilayer structure of LCD, and thus the occurrence of hillocks or voids causes a problem in which other thin films cannot be evenly laminated on the electrode thin film. In addition, when an insulating thin film is laminated on the electrode thin film, the hillocks produced on the electrode thin film protrude the upper insulating thin film to cause a problem in which an electric short circuit (electric insulation failure) occurs between layers. Furthermore, the occurrence of the voids on the electrode thin film causes the problem of producing an electrical disconnection (conduction failure) in the peripheries of the voids. Therefore, high hillock resistance and void resistance are required for preventing these problems.

[3] The reason why high corrosion resistance is required is finally described. A material used as the LCD electrode thin film is exposed to an alkaline solution such as a photoresist developer in a photolithographic step after the deposition of the electrode thin film. For example, in the use of a material having low corrosion resistance against the alkaline solution for the electrode thin film, the electrode thin film is corroded with the alkaline solution to deteriorate the precision of the electrode shape. The deterioration in precision of the electrode shape causes an electrical short circuit or disconnection in the electrode thin film. Therefore, high corrosion resistance against the alkaline solution is required for preventing the precision of the electrode shape from deteriorating due to corrosion.

As the material for the LCD electrode thin film, (1) a Ta thin film, (2) a Ti thin film, (3) a Cr thin film, (4) a Mo thin film, and the like are conventionally used. Also, (5) an Al—Ta alloy thin film, (6) an Al—Ti alloy thin film, and the like proposed by the inventors in Japanese Unexamined Patent Publication No. 5-100248, (7) an Al—Fe system (at least one of Fe, Co, Ni, Ru, Rh, Ir, and Nd) alloy thin film, and the like disclosed in Japanese Unexamined Patent Publication No. 7-4555 are used. Furthermore, the inventors proposed (8) an Al—Ni—Y thin film (Japanese Unexamined Patent Publication No. 11-3878).

The material used for the LCD electrode thin film is required to have severe characteristics by the recent trend toward a larger LCD screen and higher resolution. Particularly, lower electrical resistivity, higher hillock resistance, higher void resistance, and higher corrosion resistance are required. However, the conventional materials for electrode thin films cannot satisfy all requirements. This will be described in detail below.

[1] The shape of the LCD electrode thin film tends to be further made fine with increases in the LCD panel size and resolution. Making fine the shape causes an increase in the electric resistance of the electrode portion and interconnection portion, and an electric signal delay due to this increase in electric resistance causes a great difficulty in improving the LCD display performance. In order to prevent such an electric signal delay accompanying the formation of the electrode thin film having a finer shape, for example, in a LCD having a panel size of 10 inch or more, the electrical resistivity of the electrode thin film must be decreased to 6

μΩcm or less. However, (1) a Ta thin film has an electrical resistivity of about 180 μΩcm; (2) a Ti thin film, an electrical resistivity of about 80 μΩcm; (3) a Cr thin film, an electrical resistivity of about 50 μΩcm; (4) a Mo thin film, an electrical resistivity of about 50 μΩcm. Furthermore, (5) an Al—Ta alloy thin film and (6) an Al—Ti alloy thin film have an electrical resistivity of about 10 μΩcm. It is thus very difficult to use these materials as the LCD electrode thin film required to have an electrical resistivity of 6 μΩcm or less.

[2] The number of heat treatments at about 300 to 400° C. which are applied to the electrode thin film in a step after the deposition of the electrode thin film in the process for manufacturing LCD is not limited to one, and the heat treatment is repeated a plurality of times. Therefore, high hillock resistance and high void resistance are required for preventing the occurrence of hillocks or voids even when the heat treatment at about 300 to 400° C. is repeated. However, an Al—Nd alloy thin film as (7) an Al—Fe system (at least one of Fe, Co, Ni, Ru, Rh, Ir, and Nd) alloy thin film produces neither hillock nor void in one time of heat treatment, but produces hillocks or voids in not less than two times of heat treatments in some cases, thereby causing difficulties in using as the LCD electrode thin film.

[3] Furthermore, the photoresist developer used in the photolithographic step after the deposition of the electrode thin film in the process for manufacturing LCD is a strong alkaline solution, and thus high corrosion resistance against the alkaline solution is required. However, an Al—Co alloy thin film and Al—Ni alloy thin film as (7) the Al—Fe system (at least one of Fe, Co, Ni, Ru, Rh, Ir, and Nd) alloy thin film, and (8) the Al—Ni—Y alloy thin film are corroded by exposure to the strong alkaline photoresist developer, particularly an organic alkaline photoresist developer, to deteriorate the shape precision of the electrode. It is thus difficult to use these materials as the LCD electrode thin film.

As described above, the conventional materials for the electrode thin films cannot satisfy all of the requirements (low electrical resistivity, high hillock resistance, high void resistance, and high corrosion resistance) for the electrode thin films of large-size LCD and high-resolution LCD. Therefore, there have not yet been materials suitable for LCD electrode thin films, i.e., materials for electrode thin films having low electrical resistivity, high hillock resistance, high void resistance, and high corrosion resistance.

SUMMARY OF THE INVENTION

The present invention has been achieved with attention to the above circumstances. An object of the present invention is to solve the above-described problems of conventional materials, and provide an Al alloy thin film for a semiconductor device electrode having low electrical resistivity, i.e., 6 μΩcm or less, high hillock resistance, high void resistance, and high corrosion resistance against an alkaline solution, all of which are requirements for an electrode thin film of large-size LCD or high-resolution LCD. Another object of the present invention is to provide a sputtering target to deposit the Al film by sputtering process for a semiconductor device electrode.

In order to achieve the objects, the present invention provides an Al alloy thin film for a semiconductor device electrode, and a sputtering target to deposit the Al film by sputtering process for a semiconductor device electrode, which have the following construction.

The Al alloy thin film for a semiconductor device electrode of the present invention has excellent corrosion resistance, hillock resistance and void resistance, and an electrical resistivity of 6 μΩcm or less, and comprises as alloy components 0.3 at % or more of Y, and at least one of the IVa group metal elements (Ti, Zr, and Hf) in a total of 0.2 at % or more, wherein the contents of Y and the IVa group metal element satisfy the following equation (1):

$$0.3C_y + 3C_{IVa} \leq 2 \qquad \text{Equation (1)}$$

In the equation (1), $C_y$ represents the Y content (at %), and $C_{IVa}$ represents the content (at %) of the IVa group metal element.

The Al alloy thin film for a semiconductor device electrode of the present invention is deposited by a sputtering process.

In the Al alloy thin film for a semiconductor device electrode of the present invention, Y is partly or wholly precipitated as an intermetallic compound with Al, and the IVa group metal element is partly or wholly precipitated as an intermetallic compound with Al, and the intermetallic compounds are precipitated by applying heat treatment to the Al alloy thin film.

The Al alloy thin film for a semiconductor device electrode of the present invention has corrosion resistance against an alkaline solution. The Al alloy thin film for a semiconductor device electrode of the present invention has hillock resistance against repeated heat treatments, and void resistance against repeated heat treatments. The Al alloy thin film for a semiconductor device electrode of the present invention is used for an electrode of a liquid crystal display.

The sputtering target to deposit the Al film by sputtering process for a semiconductor device electrode of the present invention comprises an Al alloy comprising as alloy components 0.3 at % or more of Y, and at least one of the IVa group metal elements (Ti, Zr, and Hf) in a total of 0.2 at % or more, wherein the contents of Y and the IVa group metal elements satisfy the following equation (2):

$$0.3C_y + 3C_{IVa} \leq 2 \qquad \text{Equation (2)}$$

In the equation (2), $C_y$ represents the Y content (at %), and $C_{IVa}$ represents the content (at %) of the IVa group metal element.

In the sputtering target to deposit the Al alloy thin film by sputtering process for a semiconductor device electrode of the present invention, the Al alloy is produced by a melt casing method or a spray forming method. The sputtering target to deposit the Al film by sputtering process for a semiconductor device electrode of the present invention is adopted for an electrode of a liquid crystal display.

DESCRIPTION OF THE PREFERRED EMBODIMENTS

Figure 1:
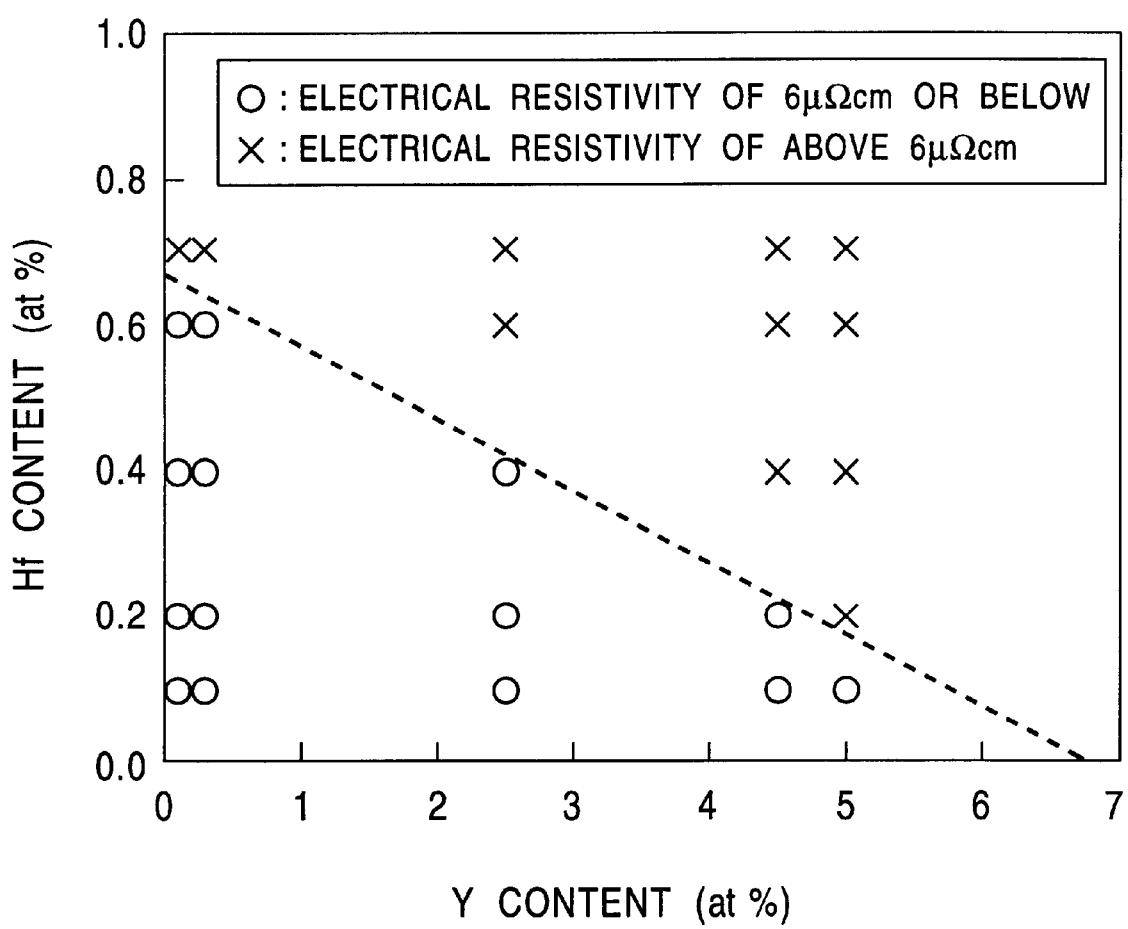
FIG. 1 is a graph illustrating the influence of the Y and Hf contents on electrical resistivity with respect to Al alloy thin films of Example 1.

The present invention is carried out, for example, as follows.

A sputtering target comprising an Al alloy containing 0.3 at % or more of Y in a range which satisfies the equation (2), and at least one of the IVa group metal elements (Ti, Zr, and Hf) in a total of 0.2 at % or more is produced by the melt casting method. As a result, a sputtering target to deposit an Al film by sputtering process for a semiconductor device electrode of the present invention is obtained.

By the sputtering process using the sputtering target, an Al alloy thin film is deposited on a substrate to obtain an Al alloy thin film for a semiconductor device electrode of the present invention.

In this way, the sputtering target to deposit an Al film by sputtering process for a semiconductor device electrode of the present invention is obtained, and the Al alloy thin film for a semiconductor device electrode of the present invention is obtained by using the sputtering target, and is used as a thin film for a semiconductor device electrode of LCD or the like.

The operation and advantages of the present invention will be described below.

In order to achieve the objects, the inventors produced Al alloy sputtering targets containing various metal elements added to Al, and formed Al alloy thin films comprising various alloy systems and compositions by the sputtering method using the sputtering targets. As a result of examination of the electrical resistivity, hillock resistance, void resistance, and corrosion resistance of each of the Al alloy thin films, the inventors found that an Al alloy thin film comprising as alloy components 0.3 at % or more of Y, and at least one of the IVa group metal elements (Ti, Zr, and Hf) in a total of 0.2 at % or more, and satisfying the equation: $0.3C_y+3C_{IVa} \leq 2$ (wherein $C_y$: Y content (at %), $C_{IVa}$: content (at %) of the IVa group metal element) has high hillock resistance and high void resistance so that hillocks and voids little occur even by repeated heat treatments after the deposition of the electrode thin film. It was also found that the Al alloy thin film exhibits a decrease in electrical resistivity after heat treatment, and can thus satisfy the requirements of high hillock resistance required before the heat treatment (or further at the time of heat treatment) and after the heat treatment, high void resistance (before heat treatment and at the time of heat treatment), and a low electrical resistivity (after heat treatment) of 6 $\mu\Omega$cm or less. It was further found that the Al alloy thin film also has excellent corrosion resistance against an alkaline solution.

The present invention has been achieved based on the above findings. Namely, on the basis of these findings, the Al alloy thin film (referred to as "the Al—Y—IVa alloy thin film" hereinafter) for a semiconductor device electrode of the present invention has excellent corrosion resistance, hillock resistance and void resistance, and an electrical resistivity of 6 $\mu\Omega$cm or less, and comprises as alloy components 0.3 at % or more of Y, and at least one of the IVa group metal elements (Ti, Zr, and Hf) in a total of 0.2 at % or more, wherein the contents of Y and the IVa group metal element satisfy the following equation (1):

$$0.3C_y+3C_{IVa} \leq 2 \qquad \text{Equation (1)}$$

In the equation (1), $C_y$ represents the Y content (at %), and $C_{IVa}$ represents the content (at %) of the IVa group metal element.

Therefore, the Al alloy thin film (the Al—Y—IVa alloy thin film) for a semiconductor device electrode of the present invention has an electrical resistivity of as low as 6 $\mu\Omega$cm or less, high hillock resistance, high void resistance, and high corrosion resistance against the alkaline solution.

The reason why the Al—Y—IVa alloy thin film of the present invention exhibits an electrical resistivity of as low as 6 $\mu\Omega$cm or less is described below.

In an Al alloy thin film obtained by the sputtering deposition method, the alloy elements and Al form a complete solid solution in Al matrix. Thus, the Al alloy thin film exhibits high electrical resistivity due to scattering of conduction electrons by the dissolved alloy elements. However, in the Al—Y—IVa alloy thin film of the present invention, the alloy elements, i.e., Y and IVa group metal element (Ti, Zr, or Hf), do not increase the electrical resistivity dramatically even in the solid solution state with Al. In addition, each of Y and IVa group metal element dissolved in the Al—Y—IVa alloy thin film after deposition is partly or wholly precipitated as an intermetallic compound with Al by the heat treatment in the step after the deposition of the electrode thin film to obtain an electrical resistivity of as low as 6 $\mu\Omega$cm or less after the heat treatment. The intermetallic compounds are precipitated at the crystal grain boundaries and/or in the crystal grains.

Description will now be made of the reasons why the Al—Y—IVa alloy thin film of the present invention exhibits high hillock resistance and void resistance against repeated heat treatments after the deposition of the electrode thin film.

In the Al—Y—IVa alloy thin film obtained by the sputtering deposition method, the alloy elements, i.e., Y and the IVa group metal element, are dissolved in Al matrix, and the Al—Y—IVa alloy thin film of the present invention thus exhibits high yield stress due to solid solution strengthening of Y and the IVa group metal element. In addition, by containing Y and the IVa group metal element, Al crystal grains are made fine, and the crystal grain boundaries are strengthened by the fine crystal grains to further increase the yield stress of the Al—Y—IVa alloy thin film of the present invention. Therefore, in the first heat treatment of the Al—Y—IVa alloy thin film of the present invention, the Al—Y—IVa alloy thin film exhibits high yield stress due to solid solution strengthening and crystal grain boundary strengthening to inhibit the occurrence of hillocks and voids, which are included in a type of plastic deformation, thereby exhibiting high hillock resistance and high void resistance against the heat treatment. In the Al—Y—IVa alloy thin film suffering one heat treatment, each of Y and the IVa group metal element is partly or wholly precipitated as an intermetallic compound with Al, and thus the Al—Y—IVa alloy thin film exhibits high yield stress due to precipitation strengthening by the intermetallic compounds. Therefore, even in at least two times (the second or later) of heat treatment of the Al—Y—IVa alloy thin film, the occurrence of hillocks and voids is inhibited by the precipitation strengthening, thereby exhibiting high hillock resistance and high void resistance against repeated heat treatments. Furthermore, the effects of solid solution strengthening, grain boundary strengthening, and precipitation strengthening by the intermetallic compounds increase with increases in the contents of Y and the IVa group metal element, to further increase the yield stress of the Al—Y—IVa alloy thin film, thereby obtaining higher hillock resistance and higher void resistance. In this case, an increase ratio in electrical resistivity with Y content is less than an increase ratio in electrical resistivity with the IVa group metal element. From the viewpoint of improving the hillock resistance and the void resistance without significantly increasing the electrical resistivity, it is preferable that the Y content is higher than the content of the IVa group metal element under the restriction of an electrical resistivity of 6 $\mu\Omega$cm or less.

The reason why the Al—Y—IVa alloy thin film of the present invention exhibits high corrosion resistance is described below.

In general, an Al alloy thin film containing a noble metal element as compared with Al, for example, Co or Ni, as an alloy component is significantly corroded by exposure to the strong alkaline organic photoresist developer to cause pit corrosion (pit-shaped corrosion mark) on the surface of the Al alloy thin film. However, the alloy component Y of the Al—Y—IVa alloy thin film of the present invention is a base metal element as compared with Al, and the IVa group metal element as the alloy component is a metal element exhibiting properties equivalent to Al, and thus the Al—Y—IVa alloy thin film is not corroded by exposure to the strong alkaline organic photoresist developer, and exhibits high corrosion resistance.

The reasons for limiting the contents of Y and the IVa group metal element of the Al—Y—IVa alloy thin film of the present invention are described below.

Figure 2:
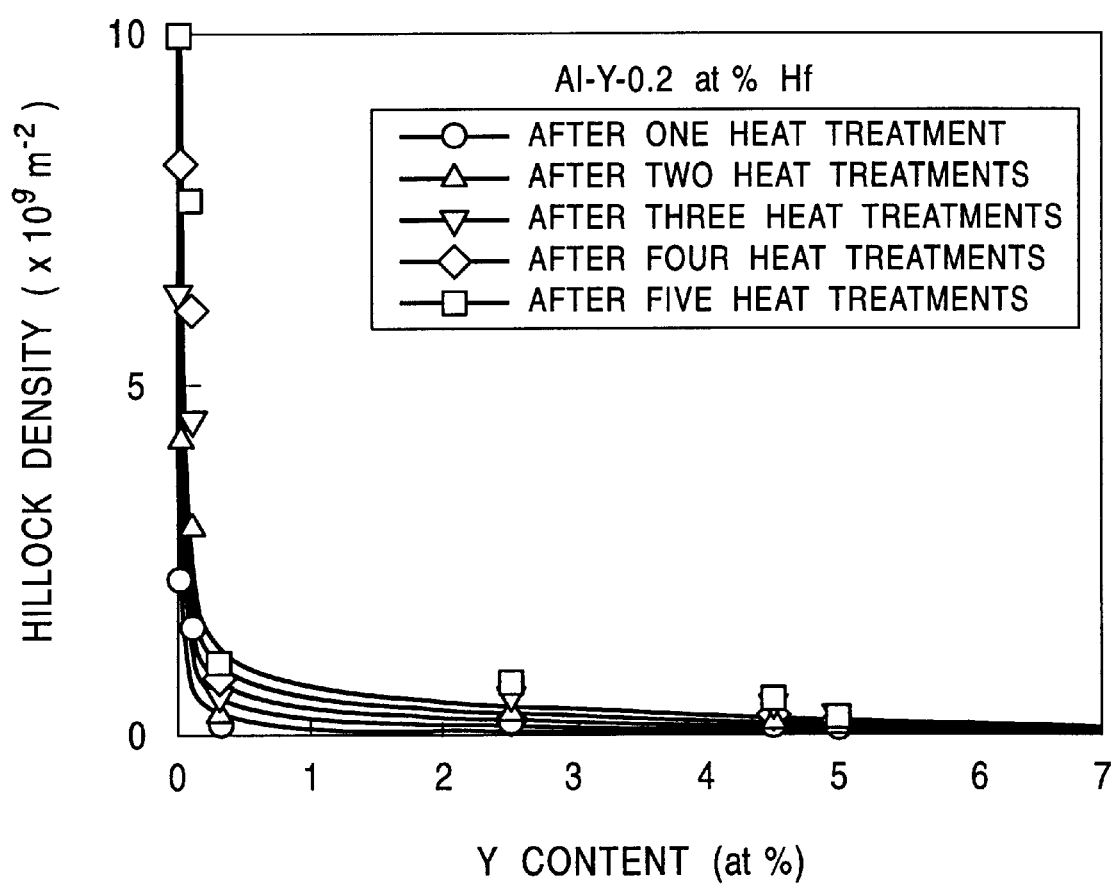
FIG. 2 is a graph illustrating the influence of the Y content on the hillock density with respect to Al alloy thin films of Example 2.
Figure 4:
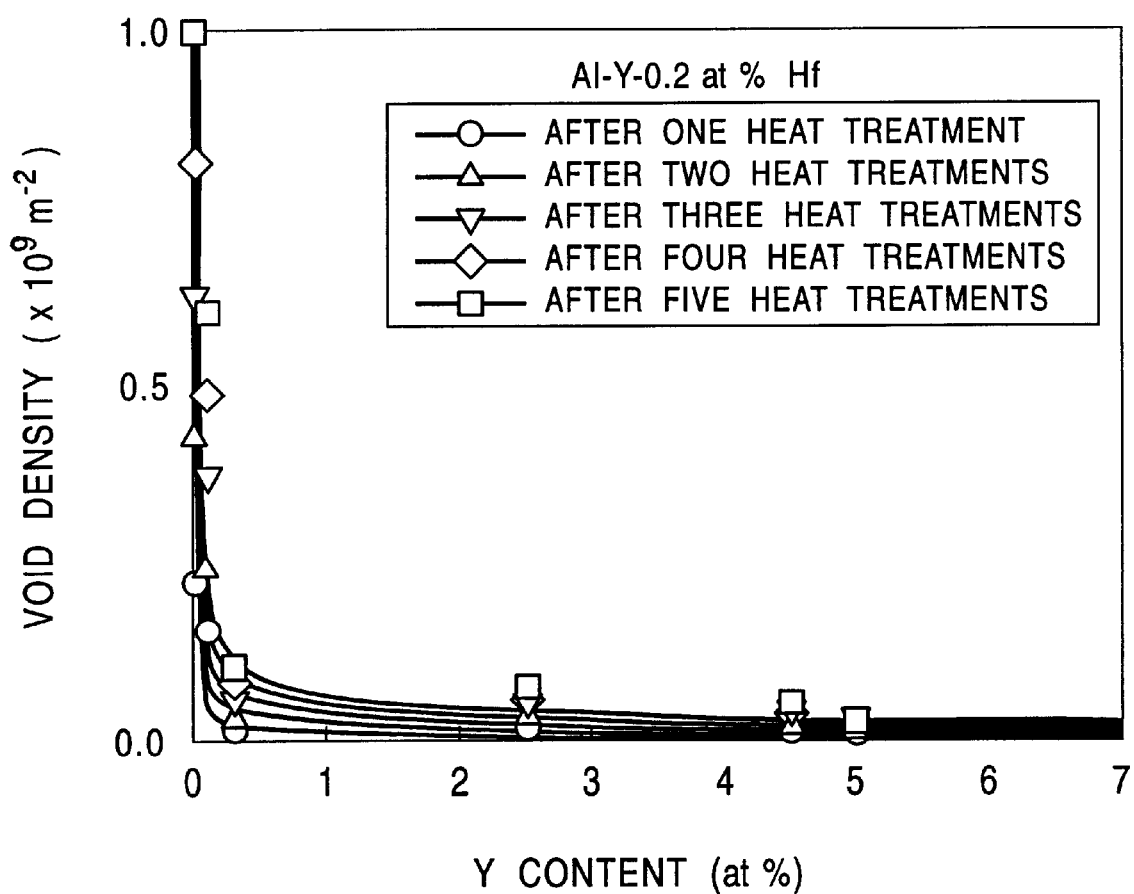
FIG. 4 is a graph illustrating the influence of the Y content on the void density with respect to Al alloy thin films of Example 2.

With a Y content of 0.3 at % as a border, Y at a content of 0.3 at % or more causes high hillock resistance and high void resistance, while Y at a content of less than 0.3 at % does not cause the sufficient effect of improving the hillock resistance and the void resistance, thereby failing to cause high hillock resistance and high void resistance, i.e., sufficient hillock resistance and void resistance. This can be seen from, for example, FIGS. 2 and 4 related to examples which will be described below. Namely, FIG. 2 shows the relation between the Y content and the hillock resistance (the number of hillocks per unit surface area) of Al—Y—IVa alloy thin films in five repetitions of heat treatment at 300° C. for 30 minutes. FIG. 2 reveals that with a Y content of 0.3 at % as a border, Y at a content of less than 0.3 at % significantly increases the hillock density, and thus does not cause sufficient hillock resistance. On the other hand, FIG. 4 shows the relation between the Y content and the void resistance (the number of voids per unit surface area) of Al—Y—IVa alloy thin films in five repetitions of heat treatment at 300° C. for 30 minutes. FIG. 4 reveals that with a Y content of 0.3 at % as a border, Y at a content of less than 0.3 at % significantly increases the void density, and thus does not cause sufficient void resistance. Therefore, the Y content must be 0.3 at % or more. From this viewpoint, the Y content is limited to 0.3 at % or more.

Figure 6:
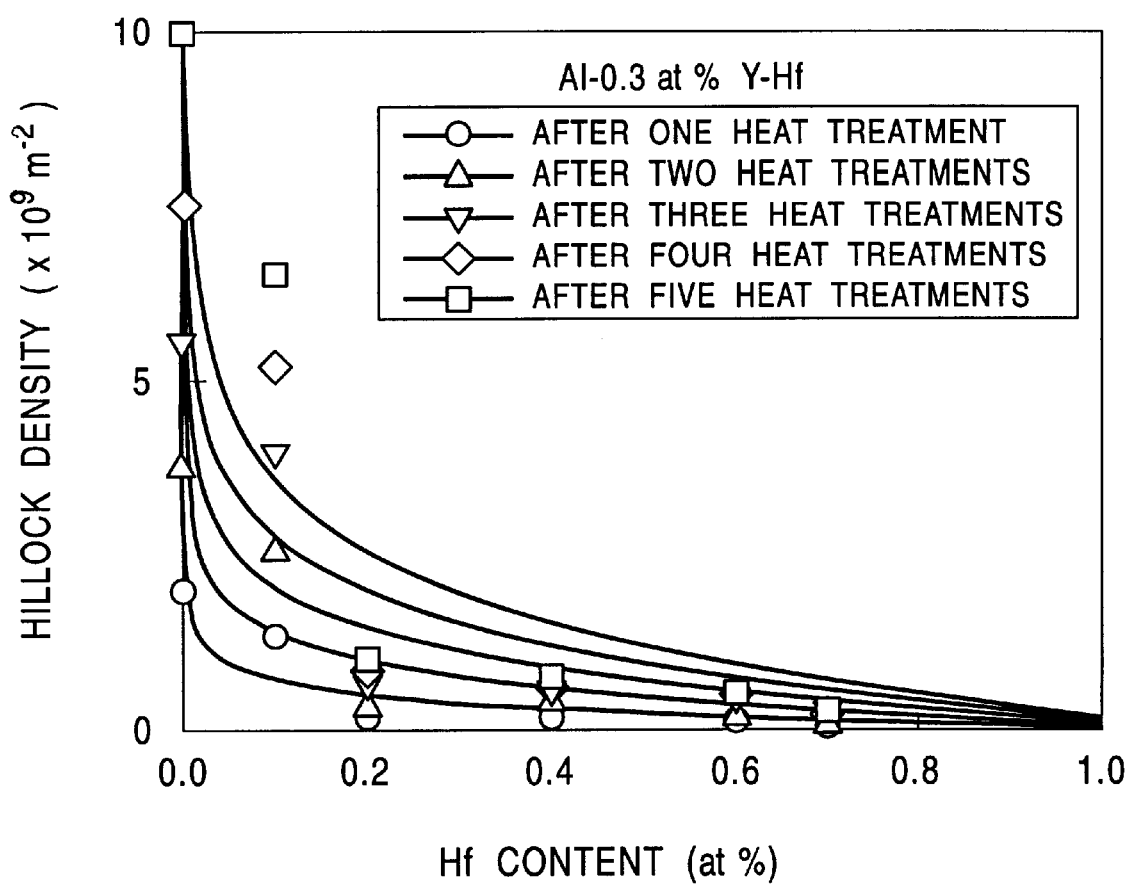
FIG. 6 is a graph illustrating the influence of the Hf content on the hillock density with respect to Al alloy thin films of Example 3.
Figure 8:
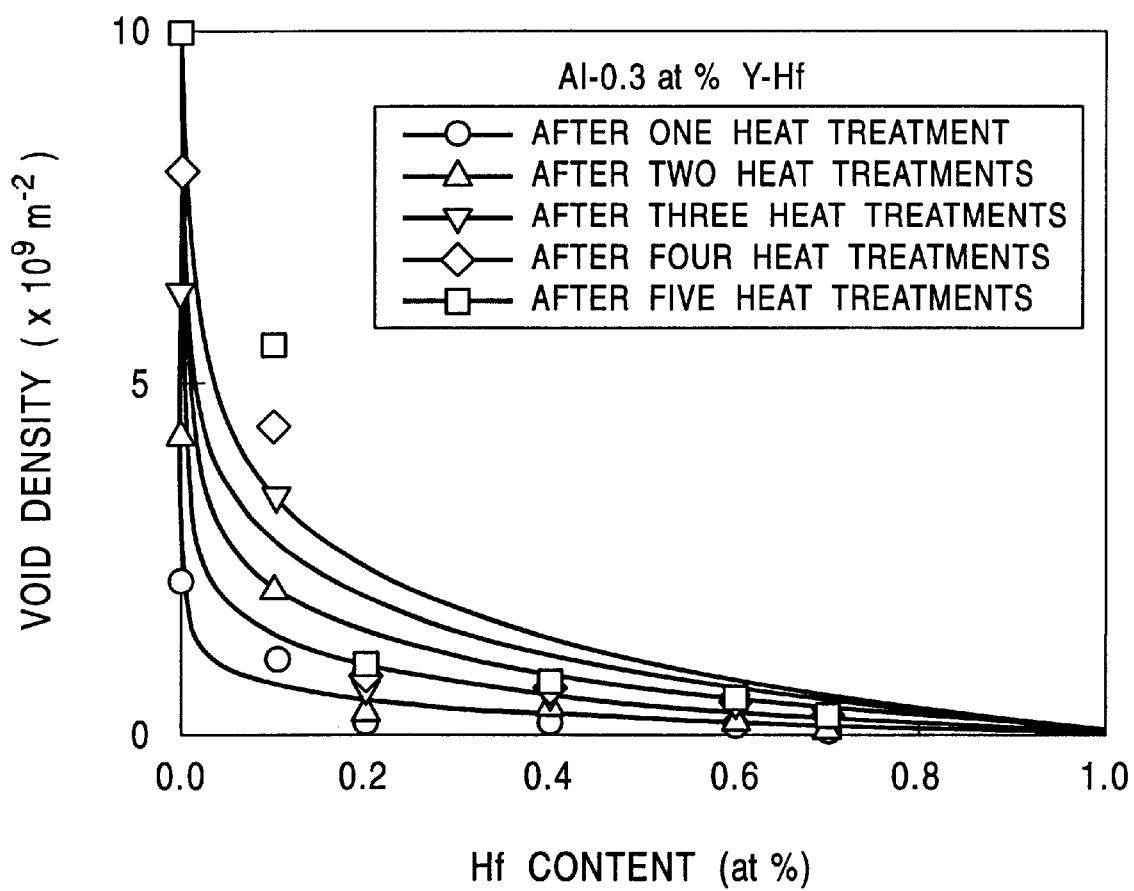
FIG. 8 is a graph illustrating the influence of the Hf content on the void density with respect to Al alloy thin films of Example 3.

With a content of the IVa group metal element of 0.2 at % as a border, the IVa group metal element at a content of 0.2 at % or more causes high hillock resistance and high void resistance, while the IVa group metal element at a content of less than 0.2 at % does not cause the sufficient effect of improving the hillock resistance and the void resistance, thereby failing to cause high hillock resistance and high void resistance, i.e., sufficient hillock resistance and void resistance. This can be seen from, for example, FIGS. 6 and 8 related to the examples which will be described below. Namely, FIG. 6 shows the relation between the Hf (a IVa group metal element) content and the hillock resistance of Al—Y—IVa alloy thin films in five repetitions of heat treatment at 300° C. for 30 minutes. FIG. 6 reveals that with a Hf content of 0.2 at % as a border, Hf at a content of less than 0.2 at % significantly increases the hillock density, and thus does not cause sufficient hillock resistance. On the other hand, FIG. 8 shows the relation between the Hf content and the void resistance of Al—Y—IVa alloy thin films in five repetitions of heat treatment at 300° C. for 30 minutes. FIG. 8 reveals that with a Hf content of 0.2 at % as a border, Hf at a content of less than 0.2 at % significantly increases the void density, and thus does not cause sufficient void resistance. Therefore, the content of the IVa group metal element must be 0.2 at % or more. From this viewpoint, the content of the IVa group metal element is limited to 0.2 at % or more.

With a Y content of 0.3 at % or more, the hillock resistance and the void resistance are improved with increasing the Y content, while a content of the IVa group metal element of 0.2 at % or more, the hillock resistance and the void resistance are improved with increasing the IVa group metal element content. However, when the content of Y and/or the IVa group metal element is excessively increased to have the relation $0.3C_y+3C_{IVa}>2$ (wherein $C_y$: Y content (at %), $C_{IVa}$: content of the IVa group metal element (at %)), the electrical resistivity (after heat treatment) is significantly increased to exceed 6 $\mu\Omega$cm. On the other hand, where the relation $0.3C_y+3C_{IVa}\leq 2$ is satisfied, an electrical resistivity of as low as 6 $\mu\Omega$cm or less is obtained. This can be seen from FIG. 1 related to the examples which will be described below. Namely, FIG. 1 shows the relation between the Y and Hf contents and the electrical resistivity (after heat treatment) of Al—Y—IVa alloy thin films. In FIG. 1, a dotted line can be represented by the equation $0.3C_y+3C_{Hf}=2$ (wherein $C_y$: Y content (at %), $C_{Hf}$: Hf content (at %)). FIG. 1 reveals that an electrical resistivity of over 6 $\mu\Omega$cm is obtained in the region (the region of $0.3C_y+3C_{Hf}>2$) above the dotted line, while an electrical resistivity of 6 $\mu\Omega$cm or less is obtained in the region (the region of $0.3C_y+3C_{Hf}\leq 2$) below the dotted line. Therefore, in order to obtain an electrical resistivity of 6 $\mu\Omega$cm or less, it is necessary that the content of Y and/or the IVa group metal element satisfies $0.3C_y+3C_{Hf}\leq 2$. From this viewpoint, the content is set to satisfy $0.3C_y+3C_{Hf}\leq 2$.

The type of the IVa group metal element contained in the Al—Y—IVa alloy thin film of the present invention is not limited, and at least one of Ti, Zr, and Hf can be used. However, the use of Hf brings about excellent hillock resistance, void resistance and corrosion resistance under the restriction of an electrical resistivity of 6 $\mu\Omega$cm or less, as compared with the use of Ti or Zr. From this viewpoint, Hf is preferably contained. In containing Hf, the Hf content is preferably 0.3 to 0.5 at %, and the Y content is preferably 0.5 to 2.5 at %. This is because the hillock resistance, the void resistance, and the corrosion resistance can be further improved under the restriction of an electrical resistivity of 6 $\mu\Omega$cm or less.

Besides Y and the IVa group metal element as the alloy components, the Al—Y—IVa alloy thin film of the present invention is allowed to contain other metal elements and impurity elements such as oxygen and the like this, which are inevitably contained in the step of producing the sputtering target to deposit the Al—Y—IVa alloy thin film and the step of depositing the Al—Y—IVa alloy thin film, or which are contained in a range causing no inhibition of the characteristics of the Al—Y—IVa alloy thin film of the present invention. However, in general, these elements possibly increase the electrical resistivity of the Al—Y—IVa alloy thin film to deteriorate the characteristics of the Al—Y—IVa alloy thin film, and thus the contents of these elements must be suppressed to as low a level as possible. Particularly, oxygen forms $Al_2O_3$ in the Al—Y—IVa alloy thin film to significantly increase the electrical resistivity of the Al—Y—IVa alloy thin film and deteriorate the properties of them, and thus the oxygen content must be suppressed to as low a level as possible. From this viewpoint, the oxygen amount is preferably 1000 ppm or less. Also, the total amount of impurities other than Y and the IVa group metal element is preferably 1000 ppm or less.

In order to prevent alloy spikes with a Si semiconductor thin film, and in order to ensure the reliability of electrical connection with the Si semiconductor thin film, the Al—Y—IVa alloy thin film of the present invention is allowed to contain Si in a range which does not deteriorate the properties of the Al—Y—IVa alloy thin film. The alloy spikes mean many recesses produced by the entrance of Al in the semiconductor thin film due to mutual diffusion between an Al thin film and the Si semiconductor thin film in contact with each other during heat treatment.

The Al—Y—IVa alloy thin film of the present invention is preferably deposited by the sputtering process. The reason for this is described below. Besides the sputtering process, the Al—Y—IVa alloy thin film of the present invention can be deposited by vacuum vapor deposition, ion plating, chemical vapor deposition, or the like. However, the Al—Y—IVa alloy thin film deposited by the sputtering process exhibits excellent uniformity in the contents of Y and the IVa group metal element. Although Y and the IVa group metal element have a very low solubility limit in Al in equilibrium state, Y and the IVa group metal element form a solid solution in sputter-deposited films nevertheless their solubility limit is lower in equilibrium state. This solid solution strengthening of Y and the IVa group metal element permits the achievement of high hillock resistance and void resistance, as compared with Al alloy film deposited by other conventional thin film deposition processes.

The Al—Y—IVa alloy thin film of the present invention is deposited by the sputtering process or the like, and at this time, each of Y and the IVa group metal element as the alloy components is wholly or partly dissolved to exhibit excellent hillock resistance and void resistance. In subsequent heat treatment, each of Y and the IVa group metal element as the alloy components is wholly or partly precipitated as an intermetallic compound to obtain an electrical resistivity of as low as 6 $\mu\Omega$cm or less after heat treatment, and excellent corrosion resistance. Therefore, it is rather said that the Al—Y—IVa alloy thin film of the present invention positively uses the inevitable heat treatment in the step after the deposition of the electrode thin film as heat treatment for precipitating the intermetallic compounds to improve the characteristics of the thin film itself.

The degree with which the dissolved elements are precipitated as the intermetallic compounds by the heat treatment is preferably set according to thermal history conditions, the amounts of the dissolved elements before heat treatment, and the required low electrical resistivity, high hillock resistance, high void resistance, and corrosion resistance. However, the preferred amount of precipitation is described below.

The ratio of the intermetallic compound formed by Y and Al is preferably 70% or more based on the amount of Y dissolved in an $\alpha$-Al matrix in an as-deposited state. The amount of precipitation of a dissolved element as an intermetallic compound depends upon the amount of the metal element in as-deposited state, and annealing conditions (particularly, the heat treatment temperature). However, of the alloy elements, Y is readily precipitated from a solid solution state by heat treatment, and begins to precipitate at 150° C. or more. The amount of precipitation increases as the annealing temperature increases. The dissolved Y is substantially wholly precipitated by annealing to about 300° C., and precipitation substantially terminates by annealing at 300° C. or above. This is because substitutional dissolution of Y in the $\alpha$-Al matrix causes great lattice mismatch with the $\alpha$-Al matrix, and low activation energy of precipitation. In precipitation, the dissolved Y is precipitated at the crystal grain boundaries of the $\alpha$-Al matrix accompanied with crystal grain growth of the $\alpha$-Al matrix. Therefore, by precipitating 70% or more of the dissolved Y as the intermetallic compound, a desired low electrical resistivity (electrical resistivity: 6 $\mu\Omega$cm or less) can be realized even in an alloy thin film containing much Y in an as-deposited state, while exhibiting precipitation strengthening by the intermetallic compound.

The ratio of the intermetallic compound formed by a IVa group metal and Al is preferably 50% or more based on the amount of Y dissolved in an $\alpha$-Al matrix in an as-deposited state. The amount of precipitation of a dissolved element as an intermetallic compound depends upon the amount of the metal element in as-deposited state, and annealing conditions (particularly, the heat treatment temperature). However, of the alloy elements, the IVa group metal is relatively difficult to precipitate from a solid solution state by heat treatment. The amount of the IVa group metal precipitated also increases with increasing annealing temperature, and about a half the amount of the dissolved IVa group metal is precipitated by heating to about 300° C., leaving the remainder in the solid solution state. Although the amount of precipitation is further increased with increasing the annealing temperature, the IVa group metal is not completely precipitated even after heating to 400° C., leaving a portion thereof in the solid solution state. Therefore, by precipitating 50% or more of the dissolved IVa group metal as the intermetallic compound, extremely high hillock resistance and void resistance can be exhibited by precipitation strengthening by the intermetallic compounds and dissolution strengthening by the IVa group metal present in the solid solution state. Although the IVa group metal greatly increases the electrical resistivity before and after heat treatment as compared with Y, a desired low electrical resistivity (electrical resistivity: 6 $\mu\Omega$cm or less) can be realized even by containing the IVa group metal in an amount less than the Y amount.

In order to precipitate Y and the IVa group metal element as the intermetallic compounds, the temperature of the heat treatment must be 150° C. or more, and with an annealing temperature of over 400° C., hillocks or voids occur in the heat treatment in some cases. From this viewpoint, the temperature of the heat treatment is preferably 150 to 400° C.

With respect to precipitation of the intermetallic compounds, the presence of precipitates and the identification thereof (decision of the types of compounds) can easily be confirmed by XRD (particularly, thin film XRD). The amount of precipitation can also be qualitatively estimated by comparison of XRD signal peaks. In regard to the amount of the precipitated intermetallic compounds, the amount of precipitation can be quantitatively measured by specifying the precipitate by TEM or SEM, and performing EDS analysis and comparison of the precipitate and the α-Al matrix. In regard to the state of the intermetallic compounds precipitated, the sizes of the precipitates, the precipitation sites, and the distribution state can be examined by TEM or SEM observation. Also, the coherency (crystal orientation) between the α-Al matrix and the precipitates can be examined by SAD (Selected Area Diffraction) measurement by TEM.

As described above, the Al—Y—IVa alloy thin film of the present invention has excellent corrosion resistance. The corrosion resistance prevents the Al—Y—IVa alloy thin film from being corroded by exposure to the strong alkaline organic photoresist developer, particularly an alkaline solution. As described above, the Al—Y—IVa alloy thin film of the present invention has excellent hillock resistance and void resistance, particularly have high hillock resistance and void resistance against repeated heat treatments in the step after the deposition of the electrode thin film.

As described above, the Al—Y—IVa alloy thin film of the present invention has excellent properties, and can thus be suitably used as an Al alloy thin film for a semiconductor device electrode. Particularly, the Al—Y—IVa alloy thin film of the present invention can suitably be used as an Al alloy thin film for LCD electrodes, which is required to have an electrical resistivity of as low as 6 $\mu\Omega$cm or less, high hillock resistance, high void resistance, and high corrosion resistance.

The sputtering target (referred to as "the sputtering target of the present invention" hereinafter) to deposit Al film by sputtering process for a semiconductor device electrode of the present invention comprises an Al alloy comprising as alloy components 0.3 at % or more of Y, and at least one of the IVa group metal elements (Ti, Zr, and Hf) in a total of 0.2 at % or more, wherein the contents of Y and the IVa group metal element satisfy the following equation (2):

$$0.3C_y + 3C_{IVa} \leq 2 \qquad \text{Equation (2)}$$

In the equation (2), $C_y$ represents the Y content (at %), and $C_{IVa}$ represents the content (at %) of the IVa group metal element.

Since the sputtering target of the present invention has the same composition as the Al—Y—IVa alloy thin film of the present invention, it is possible to ensure the reproducibility of the composition of the Al—Y—IVa alloy thin film of the present invention, the uniformity of the contents of Y and the IVa group metal element, and the performance of the thin film.

The Al alloy of the sputtering target of the present invention can preferably be produced by the melt casing or spray foaming process. The sputtering target comprising the Al alloy obtained by such a process is an integral type in which Y and the IVa group metal element as the alloy components are uniformly dissolved or dispersed in Al matrix, and has uniformity in the entire material and a low oxygen content. Therefore, the resultant Al alloy has the advantages that the composition can easily be stabilized, and the oxygen content can be decreased, as compared with a divided sputtering target in which the alloy components are simply compounded or combined, for example, such as a sputtering target in which chips of Y and the IVa group metal element are arranged on an Al sputtering target. The melt casting process is a method of producing a cast slab from an Al alloy melt. The spray forming process is a method of blowing a high-pressure inert gas to an Al alloy melt in a chamber in an inert gas atmosphere to form fine particles so that semi-solidified fine particles are deposited on a tray to produce a billet. The cast slab or billet is used as the sputtering target without processing or after appropriate processing.

The sputtering target of the present invention has the above-described excellent characteristics, and can thus be suitably used as a sputtering target to deposit an Al alloy thin film for a semiconductor device electrode by sputtering. Particularly, the sputtering of the present invention can suitably used as a sputtering target to deposit an Al alloy thin film by sputtering process for LCD electrodes, which is required to have an electrical resistivity of as low as 6 $\mu\Omega$cm or less, high hillock resistance, high void resistance, and corrosion resistance.

EXAMPLES

Example 1

A sputtering target (melted Al—Y—IVa alloy sputtering target) comprising an Al alloy containing fixed amounts of Y and Hf was produced by the melt casting process. By using the sputtering target, an Al alloy thin film (Al—Y—Hf alloy thin film) was deposited to a thickness of 350 nm on a Corning No. 7059 glass substrate having a diameter of 50 mm and a thickness of 0.5 mm by a DC magnetron sputtering process. In this example, the Y content was changed in the range of 0.1 to 5.0 at %, and the Hf content was changed in the range of 0.1 to 0.7 at %. Namely, Al-xat % Y-yat % Hf (x=0.1 to 0.5, y=0.1 to 0.7) alloy thin films were formed.

The compositions of the thin films were analyzed by ICP (Inductively Coupled Plasma) emission spectroscopy. Next, each of the thin films was processed in a pattern for measuring electrical resistivity, which had a line width of 100 $\mu$m, and a line length of 10 mm, by using photolithography and wet etching. As an etchant for wet etching, a mixture of $H_3PO_4:HNO_3:H_2O=75:5:20$ was used. Then, the thin films were heat-treated under vacuum (a degree of vacuum of $2.0 \times 10^{-6}$ Torr or less) by using a hot-wall type heat treatment furnace.

After the heat treatment, the electrical resistivity of each of the thin films was measured at room temperature by a DC four-point probe method. The results are shown in Table 1. Table 1 reveals that Nos. 7, 8, 9, 12, 13, and 17 satisfy the requirements of the present invention, i.e., $Y \geq 0.3$ at %, $Hf \geq 0.2$ at %, and $0.3C_y + 3C_{Hf} \leq 2$ (wherein $C_y$: Y content (at %), $C_{Hf}$: Hf content (at %)). These samples are examples of the present invention all of which exhibit an electrical resistivity of 6 $\mu\Omega$cm or less. On the other hand, Nos. 5, 10, 14, 15, 18, 19, 20, 22, 23, 24, and 25 do not satisfy any of the requirements of the present invention, and are comparative examples all of which exhibit an electrical resistivity of over 6 $\mu\Omega$cm. In comparative example Nos. 1, 2, 3, 4, 6, 11, and 16, the electrical resistivity is 6 $\mu\Omega$cm or less, but high hillock resistance and high void resistance cannot be obtained because of Y<0.3 at % or Hf<0.2 at %, thereby causing the problem of insufficient hillock resistance and void resistance.

FIG. 1 shows the relation between the Y/Hf contents and the electrical resistivity of the thin films. In FIG. 1, the electrical resistivity values of Nos. 1 to 25 shown in Table 1 are rearranged in relation to the Y content and the Hf content. In the figure, a dotted line can be represented by the equation $0.3C_y + 3C_{Hf} = 2$ (wherein $C_y$: Y content (at %), $C_{Hf}$: Hf content (at %)). FIG. 1 reveals that the electrical resistivity exceeds 6 $\mu\Omega$cm in the region (the region of $0.3C_y + 3C_{Hf} > 2$) above the dotted line, as shown by marks x in FIG.

1. On the other hand, an electrical resistivity of 6 $\mu\Omega$cm or less is obtained in the region (the region of $0.3C_y+3C_{Hf}\leq 2$) below the dotted line, as shown by marks o in FIG. 1. Therefore, from the viewpoint of electrical resistivity, it was confirmed that $0.3C_y+3C_{Hf}\leq 2$ must be satisfied.

TABLE 1

| No. | $C_y$ (at %) | $C_{Hf}$ (at %) | $0.3C_y + 3C_{Hf}$ | Electrical resistivity ($\mu\Omega$cm) | Remarks |
|---|---|---|---|---|---|
| 1 | 0.1 | 0.1 | 0.33 | 4.3 | Comparative |
| 2 | 0.1 | 0.2 | 0.63 | 4.6 | Example |
| 3 | 0.1 | 0.4 | 1.23 | 5.2 | |
| 4 | 0.1 | 0.6 | 1.83 | 5.8 | |
| 5 | 0.1 | 0.7 | 2.13 | 6.1 | |
| 6 | 0.3 | 0.1 | 0.39 | 4.4 | |
| 7 | 0.3 | 0.2 | 0.69 | 4.7 | Example |
| 8 | 0.3 | 0.4 | 1.29 | 5.3 | |
| 9 | 0.3 | 0.6 | 1.89 | 5.9 | |
| 10 | 0.3 | 0.7 | 2.19 | 6.2 | Comparative |
| 11 | 2.5 | 0.2 | 1.05 | 5.1 | Example |
| 12 | 2.5 | 0.2 | 1.35 | 5.4 | Example |
| 13 | 2.5 | 0.4 | 1.95 | 6.0 | |
| 14 | 2.5 | 0.6 | 2.55 | 6.6 | Comparative |
| 15 | 2.5 | 0.7 | 2.85 | 6.9 | Example |
| 16 | 4.5 | 0.1 | 1.65 | 5.7 | |
| 17 | 4.5 | 0.2 | 1.95 | 6.0 | Example |
| 18 | 4.5 | 0.4 | 2.55 | 6.6 | Comparative |
| 19 | 4.5 | 0.6 | 3.15 | 7.2 | Example |
| 20 | 4.5 | 0.7 | 3.45 | 7.5 | |
| 21 | 5.0 | 0.1 | 1.80 | 5.8 | |
| 22 | 5.0 | 0.2 | 2.10 | 6.1 | |
| 23 | 5.0 | 0.4 | 2.70 | 6.7 | |
| 24 | 5.0 | 0.6 | 3.30 | 7.3 | |
| 25 | 5.0 | 0.7 | 3.60 | 7.6 | |

TABLE 2

| No. | Thin film | Pit density (mm$^{-2}$) | Corrosion resistance | Remarks |
|---|---|---|---|---|
| 7 | Al-0.3 at % Y-0.2 at % Hf alloy thin film | 0 | Excellent | Example |
| 8 | Al-0.3 at % Y-0.4 at % Hf alloy thin film | 0 | Excellent | |
| 9 | Al-0.3 at % Y-0.6 at % Hf alloy thin film | 0 | Excellent | |
| 12 | Al-2.5 at % Y-0.2 at % Hf alloy thin film | 0 | Excellent | |
| 13 | Al-2.5 at % Y-0.4 at % Hf alloy thin film | 0 | Excellent | |
| 17 | Al-4.5 at % Y-0.2 at % Hf alloy thin film | 0 | Excellent | |
| 26 | Al-0.3 at % Y-0.4 at % Ti alloy thin film | 0 | Excellent | |
| 27 | Al-2.5 at % Y-0.2 at % Ti alloy thin film | 0 | Excellent | |
| 28 | Al-0.3 at % Y-0.4 at % Zr alloy thin film | 0 | Excellent | |
| 29 | Al-2.5 at % Y-0.2 at % Zr alloy thin film | 0 | Excellent | |
| 30 | Al-2.0 at % Co alloy thin film | 500 | Poor | Comparative |
| 31 | Al-2.0 at % Ni alloy thin film | 500 | Poor | Example |
| 32 | Al-1.5 at % Ni-1.6 at % Y alloy thin film | 100 | Poor | |
| 33 | Pure Al thin film | 0 | Excellent | |

Example 2

Al alloy thin films (Al—Y—Hf alloy thin films) were formed by the same method as Example 1. However, in this example, the Hf content was 0.2 at %, and the Y content was changed in the range of 0.1 to 5.0 at %. Namely, Al-xat % Y-0.2 at % Hf (x=0.1 to 0.5) alloy thin films were formed.

Also, Al—Y-0.2 at % Ti alloy thin films, and Al—Y-0.2 at % Zr alloy thin films were formed by the same method as Example 1.

The compositions of these thin films were analyzed by ICP emission spectroscopy. Next, each of the thin films was processed in a stripe pattern with a line width of 10 $\mu$m by the same method as Example 1. Then, each of the thin films was heat-treated five times under vacuum (a degree of vacuum of $2.0\times 10^{-6}$ Torr or less) at 300° C. for 30 minutes by using the hot wall-type heat treatment furnace. After each of the heat treatments, the hillock density (the number of hillocks per unit surface area) and the void density (the number of voids per unit surface area) were measured by surface observation with an optical microscope.

The results of measurement are described below. FIG. 2 shows the relation between the Y content and the hillock density with respect to the Al—Y-0.2 at % Hf alloy thin films. FIG. 2 reveals that with a Y content of 0.3 at % as a border, Y at a content of less than 0.3 at % significantly increases the hillock density, and thus does not cause sufficient hillock resistance. Therefore, it was confirmed from the viewpoint of hillock resistance that the Y content must be 0.3 at % or more.

Figure 3:
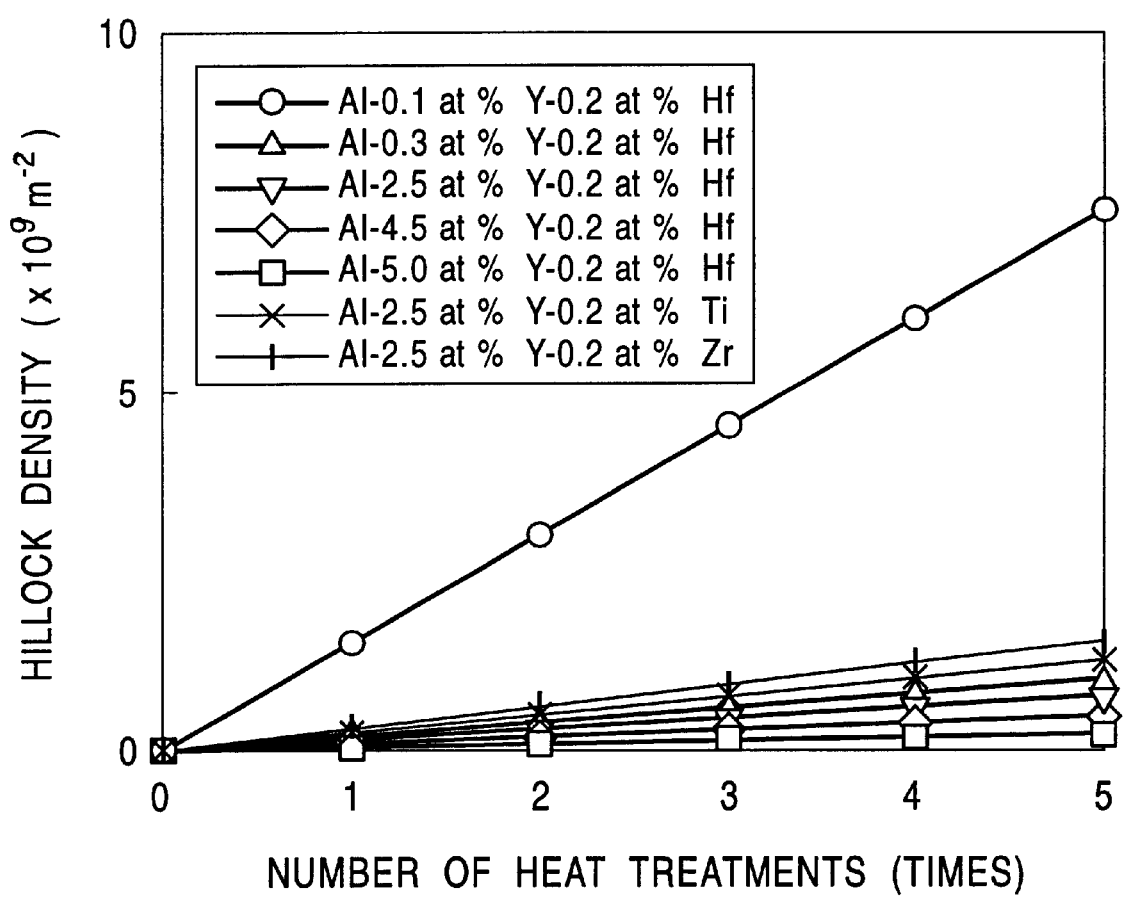
FIG. 3 is a graph illustrating the influence of the number of heat treatments on the hillock density with respect to Al alloy thin films of Example 2.

FIG. 3 shows the relation between the number of heat treatments and the hillock density with respect to the Al—Y-0.2 at % Hf alloy thin films, the Al—Y-0.2 at % Ti alloy thin film, and the Al—Y-0.2 at % Zr alloy thin film. FIG. 3 reveals that in the Al—Y-0.2 at % Hf alloy thin film having a Y content of less than 0.3 at % (marked with o and corresponding to comparative example No. 2 shown in Table 1), the hillock density increases as the number of heat treatments increases. On the other hand, in the Al—Y-0.2 at % Hf alloy thin films having a Y content of 0.3 at % or more (marked with $\Delta$, $\nabla$, $\Diamond$, and $\square$ and corresponding to comparative example Nos. 7, 12, 17, and 22 shown in Table 1), the hillock density little increases as the number of heat treatments increases. Therefore, it was confirmed that the Y content of a thin film must be 0.3 at % or more in order to obtain high hillock resistance against repeated heat treatments. Among the Al—Y-0.2 at % Hf alloy thin films (marked with O, $\Delta$, $\nabla$, $\Diamond$, and $\square$ in FIG. 3), the Al-5.0 at %Y-0.2 at % Hf alloy thin film (marked with $\square$ and corresponding to comparative example No. 22 shown in Table 1) in which $0.3C_y+3C_{Hf}>2$ exhibits an electrical resistivity of over 6 $\mu\Omega$cm and has a problem in that low electrical resistivity cannot be obtained, as shown in Table 1. Although the Al-2.5 at % Y-0.2 at % Ti alloy thin film and the Al-2.5 at % Y-0.2 at % Zr alloy thin film of examples of the present invention have a hillock density slightly higher than the Al-2.5 at % Y-0.2 at % Hf alloy thin film of an example of the present invention, the former thin films have sufficiently high hillock resistance, and no practical problem.

FIG. 4 shows the relation between the Y content and the void density with respect to the Al—Y-0.2 at % Hf alloy thin films. FIG. 4 indicates that with a Y content of 0.3 at % as a border, Y at a content of less than 0.3 at % significantly increases the void density, and thus does not cause sufficient void resistance. Therefore, from the viewpoint of void resistance, it was confirmed that the Y content must be 0.3 at % or more.

Figure 5:
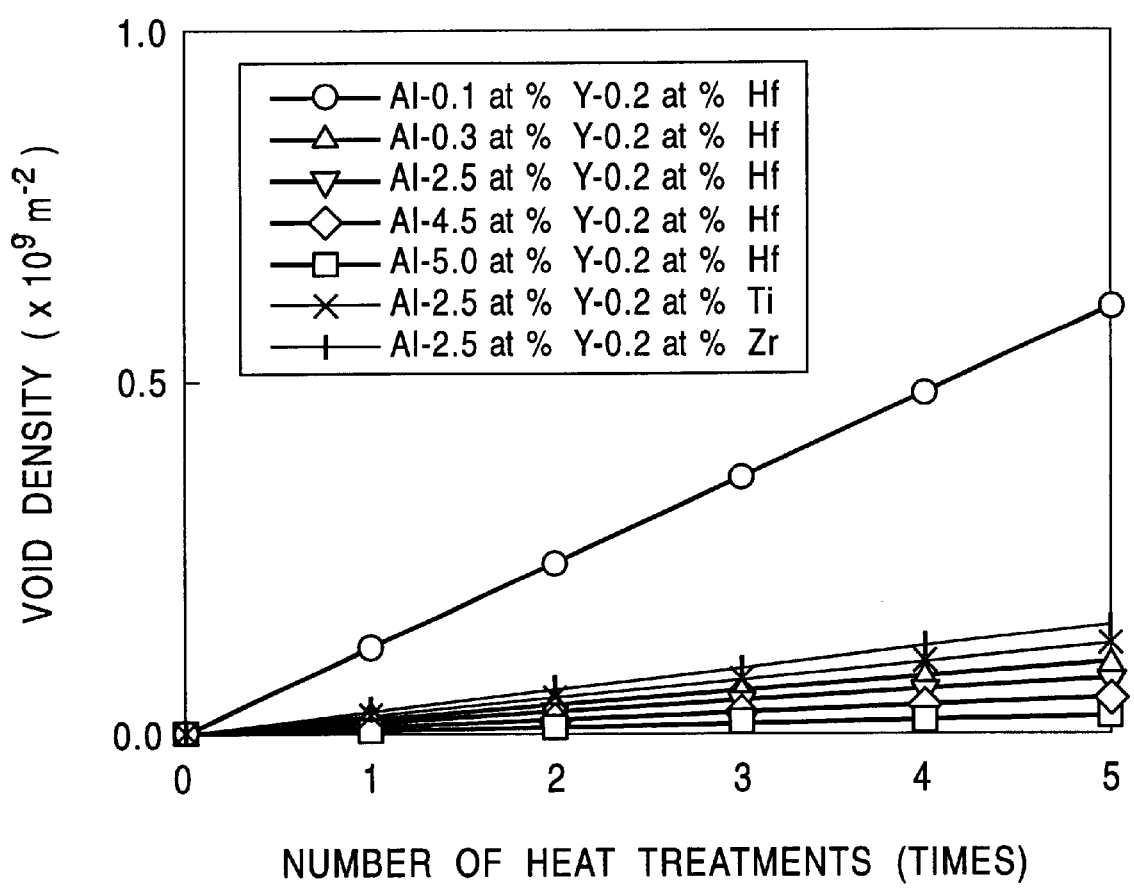
FIG. 5 is a graph illustrating the influence of the number of heat treatments on the void density with respect to Al alloy thin films of Example 2.

FIG. 5 shows the relation between the number of heat treatments and the void density with respect to the Al—Y-0.2 at % Hf alloy thin films, the Al—Y-0.2 at % Ti alloy thin film, and the Al—Y-0.2 at % Zr alloy thin film. FIG. 5 reveals that in the Al—Y-0.2 at % Hf alloy thin film having a Y content of less than 0.3 at % (marked with o and corresponding to comparative example No. 2 shown in Table 1), the void density increases as the number of heat treatments increases. On the other hand, in the Al—Y-0.2 at % Hf alloy thin films having a Y content of 0.3 at % or more (marked with Δ ∇, ◊, and □ and corresponding to comparative example Nos. 7, 12, 17, and 22 shown in Table 1), the void density little increases as the number of heat treatments increases. Therefore, it was confirmed that in order to obtain high void resistance against repeated heat treatments, the Y content of a thin film must be 0.3 at % or more. Among the Al—Y-0.2 at % Hf alloy thin films (marked with O, Δ ∇, ◊, and □ in FIG. 5), the Al-5.0 at % Y-0.2 at % Hf alloy thin film (marked with □ and corresponding to comparative example No. 22 shown in Table 1) in which $0.3C_y + 3C_{Hf} > 2$ has a problem of an electrical resistivity of over 6 μΩcm, as shown in Table 1. Although the Al-2.5 at % Y-0.2 at % Ti alloy thin film and the Al-2.5 at % Y-0.2 at % Zr alloy thin film of examples of the present invention have a void density slightly higher than the Al-2.5 at % Y-0.2 at % Hf alloy thin film of an example of the present invention, the former thin films have sufficiently high hillock resistance, and no practical problem.

Example 3

Al-0.3 at % Y-yat % Hf (y=0.1 to 0.7) alloy thin films were formed by the same method as Example 1, and Al-0.3 at % Y—Ti alloy thin films and Al-0.3 at % Y—Zr alloy thin films were also formed.

The compositions of these thin films were analyzed by ICP emission spectroscopy. Next, each of the thin films was processed in a stripe pattern with a line width of 10 μm by the same method as Example 2. Then, each of the thin films was heat-treated five times under vacuum by the same method as Example 2, and the hillock density and the void density were measured by the same method as Example 2 after each of the heat treatments.

The results of measurement are described below. FIG. 6 shows the relation between the Hf content and the hillock density with respect to the Al-0.3 at % Y—Hf alloy thin films. FIG. 6 reveals that with a Hf content of 0.2 at % as a border, Hf at a content of less than 0.2 at % significantly increases the hillock density, and thus does not cause sufficient hillock resistance. Therefore, it was confirmed from the viewpoint of hillock resistance that the Hf content must be 0.2 at % or more.

Figure 7:
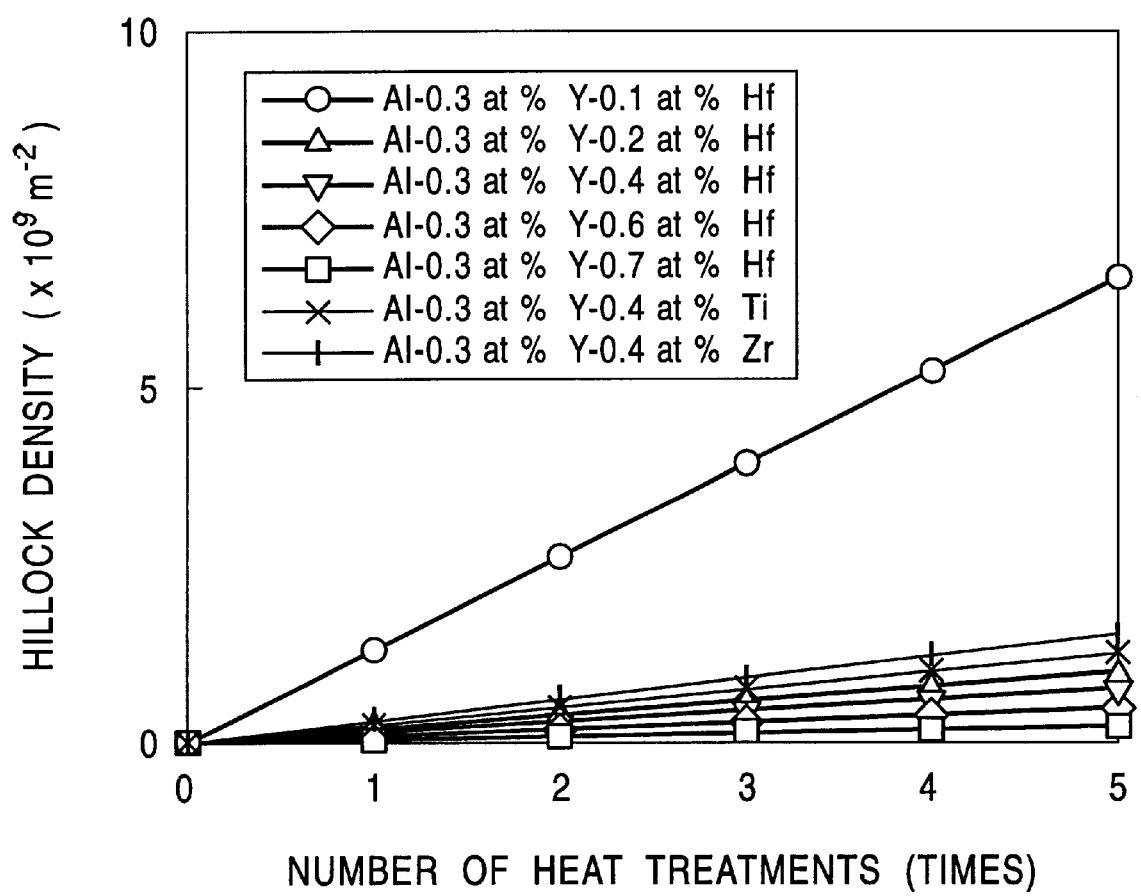
FIG. 7 is a graph illustrating the influence of the number of heat treatments on the hillock density with respect to Al alloy thin films of Example 3.

FIG. 7 shows the relation between the number of heat treatments and the hillock density with respect to the Al-0.3 at % Y—Hf alloy thin films, the Al-0.3 at % Y—Ti alloy thin film, and the Al-0.3 at % Y—Zr alloy thin film. FIG. 7 reveals that in the Al-0.3 at % Y—Hf alloy thin film having a Hf content of less than 0.2 at % (marked with o and corresponding to comparative example No. 6 shown in Table 1), the hillock density increases as the number of heat treatments increases. On the other hand, in the Al-0.3 at % Y—Hf alloy thin films having a Hf content of 0.2 at % or more (marked with Δ and □, corresponding to comparative example Nos. 7, 8, 9, and 10 shown in Table 1), the hillock density little increases as the number of heat treatments increases. Therefore, it was confirmed that in order to obtain high hillock resistance against repeated heat treatment, the Hf content of a thin film must be 0.2 at % or more. Among the Al-0.3 at % Y—Hf alloy thin films (marked with O, Δ, ∇, ◊, and □ in FIG. 7), the Al-0.3 at % Y-0.7 at % Hf alloy thin film (marked with □ and corresponding to comparative example No. 10 shown in Table 1) in which $0.3C_y + 3C_{Hf} > 2$ exhibits an electrical resistivity of over 6 μΩcm and has a problem in that low electrical resistivity cannot be obtained, as shown in Table 1. Although the Al-0.3 at % Y-0.4 at % Ti alloy thin film and the Al-0.3 at % Y-0.4 at % Zr alloy thin film of examples of the present invention have a hillock density slightly higher than the Al-0.3 at % Y-0.4 at % Hf alloy thin film of an example of the present invention, the former thin films have sufficiently high hillock resistance, and no practical problem.

FIG. 8 shows the relation between the Hf content and the void density with respect to the Al-0.3 at % Y—Hf alloy thin films. FIG. 8 indicates that with a Hf content of 0.2 at % as a border, Hf at a content of less than 0.2 at % significantly increased the void density, and thus does not cause sufficient void resistance. Therefore, from the viewpoint of void resistance, it was confirmed that the Hf content must be 0.2 at % or more.

Figure 9:
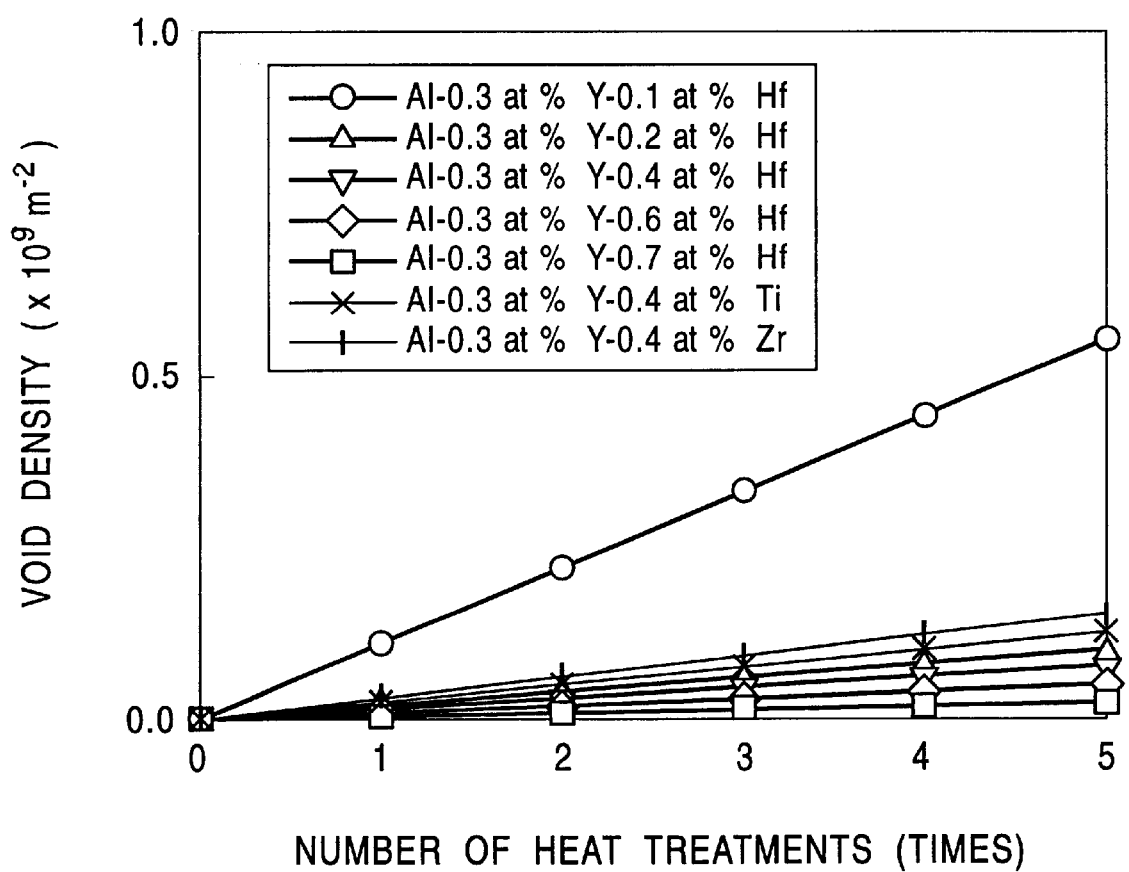
FIG. 9 is a graph illustrating the influence of the number of heat treatments on the void density with respect to Al alloy thin films of Example 3.

FIG. 9 shows the relation between the number of heat treatments and the void density with respect to the Al-0.3 at % Y—Hf alloy thin films, the Al-0.3 at % Y—Ti alloy thin film, and the Al-0.3 at % Y—Zr alloy thin film. FIG. 9 reveals that in the Al-0.3 at % Y—Hf alloy thin film having a Hf content of less than 0.2 at % (marked with o and corresponding to comparative example No. 6 shown in Table 1), the void density increases as the number of heat treatments increases. On the other hand, in the Al-0.3 at % Y—Hf alloy thin films having a Hf content of 0.2 at % or more (marked with Δ, ∇, ◊, and □ and corresponding to comparative example Nos. 7, 8, 9, and 10 shown in Table 1), the void density little increases as the number of heat treatments increases. Therefore, it was confirmed that in order to obtain high void resistance against repeated heat treatments, the Y content of a thin film must be 0.2 at % or more. Among the Al-0.3 at % Y—Hf alloy thin films (marked with O, Δ, ∇, ◊, and □ in FIG. 9), the Al-0.3 at % Y-0.7 at % Hf alloy thin film (marked with □ and corresponding to comparative example No. 10 shown in Table 1) in which $0.3C_y + 3C_{Hf} > 2$ has a problem of an electrical resistivity of over 6 μΩcm, as shown in Table 1. Although the Al-0.3 at % Y-0.4 at % Ti alloy thin film and the Al-0.3 at % Y-0.4 at % Zr alloy thin film of examples of the present invention have a void density slightly higher than the Al-0.3 at % Y-0.4 at % Hf alloy thin film of an example of the present invention, the former thin films have sufficiently high hillock resistance, and no practical problem.

Example 4

Al-xat % Y-yat % Hf (x=0.1 to 0.5, y=0.1 to 0.7) alloy thin films were formed by the same method as Example 1, and an Al—Co alloy thin film, an Al—Ni alloy thin film, an Al—Ni—Y alloy thin film, and a pure Al thin film were also formed.

The compositions of these thin films were analyzed by ICP emission spectroscopy. Next, a stripe resist pattern having a line width of 10 μm and a line interval of 10 μm was formed on the surface of each of the thin films by photolithography using an organic alkali photoresist developer. Then, a portion of each thin film exposed to the organic alkali photoresist developer was observed with an optical microscope to measure a density of pitting corrosion (the number of pits per unit area).

The results are shown in Table 2. In Table 2, samples having a pit density of 0 mm$^{-2}$ are considered as having excellent corrosion resistance, and samples having a pit density of over 0 mm$^{-2}$ are considered as having poor corrosion resistance. Table 2 indicates that in the Al-2.0 at % Co alloy thin film of comparative example No. 30, the Al-2.0 at % Ni alloy thin film of comparative example No. 31, and the Al-1.5 at % Ni-1.6 at % Y alloy thin film of comparative example No. 32, pit corrosion occurs, and thus high corrosion resistance against the organic alkali solution cannot be obtained. On the other hand, in the Al—Y—IVa alloy thin films of example Nos. 7, 8, 9, 12, 13, 17, 26, 27, 28, and 29 of the present invention, no pitting corrosion occurs, and excellent corrosion resistance can be obtained. Therefore, in these example Nos., high corrosion resistance against the organic alkali solution equivalent to the pure Al thin film of comparative example No. 33 can be obtained.

Although each of the above examples 1 to 4 uses the melted Al—Y—IVa alloy sputtering target produced by the melt casing method as the Al—Y—IVa alloy sputtering target for sputtering, the use of a melted Al—Y—IVa alloy sputtering target produced by the spray forming method produces the same results as the above examples.

An Al alloy thin film for a semiconductor device electrode of the present invention produces less hillocks and voids in repeated heat treatments, and thus has high hillock resistance and high void resistance, and an electrical resistivity of as low as 6 $\mu\Omega$cm or less after the heat treatments. Therefore, the Al alloy thin film of the present invention can satisfy the requirements of high hillock resistance and high void resistance (before heat treatment, and at the time of heat treatment), and an electrical resistivity of as low as 6 $\mu\Omega$cm or less (after heat treatment) before the heat treatment (or further at the time of the heat treatment) and after the heat treatment. The Al alloy thin film also has excellent corrosion resistance against an alkaline solution. Namely, the Al alloy thin film for a semiconductor device electrode of the present invention has an electrical resistivity of as low as 6 $\mu\Omega$cm or less, high hillock resistance, high void resistance, and high corrosion resistance against an alkaline solution, which are required for electrode thin films of large-size LCD (liquid crystal display) or high-resolution LCD. Therefore, the Al alloy thin film can be suitably used as an Al alloy thin film for a semiconductor device electrode, particularly as an Al alloy thin film for an LCD electrode which is required to have an electrical resistivity of as low as 6 $\mu\Omega$cm or less, high hillock resistance, high void resistance, and corrosion resistance. The Al alloy thin film of the present invention exhibits the effect of permitting improvements in performance and quality of these apparatuses, and the effect of making it possible to comply with and contribute to increases in size and resolution of LCD in future.

A sputtering target of the present invention can be suitably used for forming the Al alloy thin film for a semiconductor device electrode by sputtering, and has the advantage that the composition of the resultant Al alloy thin film for a semiconductor device electrode can easily be stabilized, thereby exhibiting the effect of permitting the formation of an Al alloy thin film for a semiconductor device electrode having stable characteristics.

What is claimed is:

1. An Al alloy thin film for a semiconductor device electrode with excellent corrosion resistance, hillock resistance and void resistance, and an electrical resistivity of 6 $\mu\Omega$cm or less, comprising as alloy components 0.3 atomic % or more of Y, and 0.2 atomic % or more of Hf, wherein the contents of Y and Hf satisfy the following equation (1):

$$0.3C_y + 3C_{Hf} < 2 \qquad \text{Equation (1)}$$

wherein $C_y$ represents the Y content (atomic %), and $C_{Hf}$ represents the content (atomic %) of Hf.

2. The Al alloy thin film for a semiconductor device electrode according to claim 1, deposited by a sputtering process.

3. The Al alloy thin film for a semiconductor device electrode according to claim 1, wherein Y is partly or wholly precipitated as an intermetallic compound with Al, and the Hf is partly or wholly precipitated as an intermetallic compound with Al.

4. The Al alloy thin film for a semiconductor device electrode according to claim 3, wherein the intermetallic compounds are precipitated by annealing or heat treatment of the Al alloy thin film.

5. The Al alloy thin film for a semiconductor device electrode according to claim 1, wherein the corrosion resistance is corrosion resistance in an alkaline solution.

6. The Al alloy thin film for a semiconductor device electrode according to claim 1, wherein the hillock resistance is hillock resistance against repeated heat treatments, and the void resistance is void resistance against repeated heat treatments.

7. The Al alloy thin film for a semiconductor device electrode according to claim 1, wherein the semiconductor device electrode is an electrode of a liquid crystal display.

8. A sputtering target to deposit an Al film by sputtering process for a semiconductor device electrode comprising an Al alloy comprising as alloy components 0.3 atomic % or more of Y, and 0.2 atomic % or more of Hf, wherein the contents of Y and Hf satisfy the following equation (2):

$$0.3C_y + 3C_{Hf} < 2 \qquad \text{Equation (2)}$$

wherein $C_y$ represents the Y content (atomic %), and $C_{Hf}$ represents the content (atomic %) of the Hf.

9. The sputtering target according to claim 8, wherein the Al alloy is produced by a melt casing method or a spray forming method.

* * * * *